US006986979B2

(12) United States Patent
Wang et al.

(10) Patent No.: US 6,986,979 B2
(45) Date of Patent: Jan. 17, 2006

(54) MICROCAPSULE COMPOSITION

(75) Inventors: Yongcai Wang, Webster, NY (US); Paul M. Hoderlein, Rochester, NY (US); Peter D. Rollinson, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 10 days.

(21) Appl. No.: 10/763,668

(22) Filed: Jan. 23, 2004

(65) Prior Publication Data

US 2005/0164116 A1 Jul. 28, 2005

(51) Int. Cl.
*G03F 7/004* (2006.01)
*G03F 7/032* (2006.01)

(52) U.S. Cl. .................. 430/138; 430/270.1; 430/905; 428/402.21; 428/402.22

(58) Field of Classification Search ................ 430/138, 430/270.1, 905, 402.21, 402.22
See application file for complete search history.

(56) References Cited

U.S. PATENT DOCUMENTS 4,842,978 A 6/1989 Ishikawa
4,977,060 A * 12/1990 Liang et al. ................ 430/138
4,997,874 A * 3/1991 Asano et al. ............... 524/503
5,120,475 A * 6/1992 Chen et al. .................. 264/4.7
5,264,316 A * 11/1993 Yamada et al. ............. 430/138
5,283,015 A * 2/1994 Hutchings et al. ........... 264/4.7
5,643,506 A 7/1997 Rourke
5,647,896 A * 7/1997 Nishimura et al. ...... 106/31.18
6,468,708 B1 * 10/2002 Wang et al. ................ 430/138
6,537,717 B1 * 3/2003 Gao et al. ................... 430/138
6,635,399 B2 * 10/2003 Higuchi et al. ............. 430/138

OTHER PUBLICATIONS

Yongcai Wang et al., Process of Producing Microcapsules and Product Thereof, filed on even date herewith.

* cited by examiner

*Primary Examiner*—Amanda Walke
(74) *Attorney, Agent, or Firm*—Sarah Meeks Roberts

(57) ABSTRACT

This invention relates to a composition comprising microcapsules suspended in an aqueous media, said microcapsules comprising a water immiscible material contained within an encapsulating wall of polymeric material, wherein the aqueous media contains a stabilizer comprising an anionic polymer mixture comprising a first sulfonated polystyrene polymer and a second sulfonated polystyrene polymer wherein the ratio of the weight average polymer molecular weight of the first polymer to the second polymer is greater than 2. It further relates to an imaging element comprising said microcapsules.

49 Claims, No Drawings

MICROCAPSULE COMPOSITION

FIELD OF INVENTION

This invention relates to a composition comprising microcapsules having a controlled size and size distribution. It further relates to an imaging element, in particular to a light sensitive and heat developable or light sensitive and pressure developable imaging element, comprising an image forming unit comprising said composition.

BACKGROUND OF INVENTION

Microencapsulation is the envelopment of an active agent or a core material within a solid coating. The active or core material can be in the form of a solid particle, a liquid droplet, or a gas bubble. The solid coating used to form the capsule may be, for example, an organic polymer, a wax, or an inorganic oxide. A capsule is characterized in general by parameters such as particle size and distribution, particle geometry, active contents and distribution, release mechanism, and storage stability.

Many encapsulation processes have been reported in the literature; only a few, however, have been commercialized. These include interfacial and in-situ polymerization, complex cocervation, spray drying, and fluidized-bed coating (the Wurster process). Others are used in low volume specialty applications. Interfacial polymerization is by far the most successful commercial process.

Microcapsule-based products are used in the graphic arts, adhesives, pharmaceutical, food, and pesticide industries. Carbonless copy paper is by far the largest use for microcapsules. Microcapsules containing solvents, liquid epoxy, or acrylate monomers are also manufactured commercially and used in adhesive formulations.

The patent literature has described imaging systems that utilize microcapsules as the key component for developability and color/tone scale differentiation by heat or pressure. These systems are very useful as they do not use conventional photographic wet processing. Heat or pressure developable photographic products, such as Thermo-Autochrome (Fuji Photo Film Co. Ltd.) and Cycolor Dry Media (Cycolor Inc.), have been commercially available.

Microcapsules described in the art for use in imaging applications are almost exclusively prepared by interfacial and in-situ polymerization processes. In interfacial polymerization, the materials used to form the capsule wall are in separate phases, one in the aqueous phase and the other in the oil phase. Polymerization occurs at the phase boundary. Wall formation of polyester, polyamides, and polyurea proceeds by interfacial polymerization.

Polyurea capsule walls can also be made by dissolving a polyisocyanate adduct in the oil phase. Hydrolysis of the isocyanate groups at the phase boundary form amine groups that in turn react with isocyanate groups to form urea linkages. In in-situ polymerization, the capsule wall forming materials are dissolved in the aqueous phase as resin precursors that, upon further polymerization reaction, form the walls of the microcapsules. Resin precursors used in this process include melamine-formaldehyde, urea-formaldehyde, and urea-melamine-formaldehyde polymers.

In the art of microencapsulation, the particle size and size distributions are controlled by mechanical shear, aqueous phase viscosity, and oil phase viscosity. The degree of shear and amount of shear energy produced depend significantly on the geometry of a particular shear device and residence time. For example, a higher shear rate and longer residence time would produce a finer microcapsule size. U.S. Pat. No. 5,643,506 describe a continuous process of generating microcapsules using a conventional LP. Gaulin colloid mill device.

Such a device is capable of generating a high shear rate by driving the conical motor at a very high rpm. The final microcapsule size is controlled by how fast the motor rotates, the viscosity of the oil and aqueous phases, and the ratio of the organic phase to aqueous phase. It is well known in the art that microcapsules generated by the above process have a broad size distribution and poor batch-to-batch reproducibility. There is a broad distribution of the shell thickness within the same batch of microcapsules especially when the shell forming materials are added to the oil phase. Larger particles have a thicker shell, and smaller particles have a thinner shell. This undoubtedly produces a distribution in the microcapsule permeability or the degree of impermeability.

When microcapsules are used in imaging systems such as carbonless paper or light sensitive pressure developable or heat developable image media, the microcapsule shell must be impermeable to the core materials. They must also have very low permeability to oxygen if the physical characteristics of the microcapsules are changed by free radical initiated reactions, since oxygen is an inhibitor. The microcapsule shell functions as a barrier material to prevent oxygen from infiltrating the light sensitive composition. Upon exposing the material to light, free radicals consume the oxygen present inside the capsule and the polymerization reaction proceeds. If the oxygen re-infiltrates the light sensitive composition, the photographic speed of the media is very poor.

Microcapsules need to be resistant to low pressure during normal storage and handling process, otherwise premature release of the core material will occur. In addition, microcapsules used for imaging applications need to be capable of withstanding temperatures up to 100° C. since during the manufacturing process the coating may be dried by heating. It is believed that the ability to control microcapsule size and size distribution is crucial to meet those requirements.

U.S. Pat. No. 4,842,978 describes a process for the preparation of light-sensitive microcapsules which comprises encapsulating silver halide and an ethylenically unsaturated polymerizable compound with a shell comprising an amino-aldehyde resin in an aqueous medium in the presence of an anionic protective colloid, wherein the anionic protective colloid is a mixture of pectin and a polymer comprising a repeating unit derived from stylenesulfonic acid, and the weight ratio of the pectin to the polymer ranges from 0.1 to 10.

There is still a need for microcapsule compositions having a narrow size distribution and good imaging capabilities.

SUMMARY OF THE INVENTION

This invention provides a composition comprising microcapsules suspended in an aqueous media, said microcapsules comprising a water immiscible material contained within an encapsulating wall of polymeric material, wherein the aqueous media contains a stabilizer composition comprising an anionic polymer mixture comprising a first sulfonated polystyrene polymer and a second sulfonated polystyrene polymer wherein the ratio of the weight average polymer molecular weight of the first polymer to the second polymer is greater than 2.

The microcapsules of the invention have a narrow size distribution, wherein the size is controlled not by the amount of shear, but rather by the type and amount of stabilizers utilized. The microcapsules are very robust and have excellent resistance to low pressure during normal storage and handling process, and which have excellent high temperature resistance to premature release of encapsulated materials. The microcapsules have good manufacturability with excellent batch to batch reproducibility.

DESCRIPTION OF THE PREFERRED EMBODIMENT

In a preferred embodiment the microcapsule composition of the invention, may be used in imaging materials including, for example, carbonless papers, heat sensitive imaging materials, light sensitive and heat developable imaging materials, light sensitive and pressure developable imaging materials, and ink jet image recording materials. In another embodiment of the invention, the microcapsules may be used in optical and electronic display applications, such as electrophoretic display, ferroelectric liquid crystal display, or any display based on glass or plastic or paper-like flexible substrates.

This invention provides a composition comprising microcapsules suspended in an aqueous media, said microcapsules comprising a water immiscible material contained within an encapsulating wall of polymeric material. The aqueous media contains a stabilizer composition comprising an anionic polymer mixture comprising a first sulfonated polystyrene polymer and a second sulfonated polystyrene polymer wherein the ratio of the weight average polymer molecular weight of the first polymer to the second polymer is greater than 2. In a preferred embodiment the stabilizer composition also comprises pectin.

The polymers comprise repeating unit derived from stylenesulfonic acid. Preferably the first polymer comprises greater than 50% styrene sulfonic acid monomer units, and more preferably the first polymer comprises greater than 80% styrene sulfonic acid monomer units. Preferably the first polymer has a weight average molecular weight of greater than 500,000, more preferably from 500,000 to 5,000,000 and most preferably greater than 1,000,000. Preferably the second polymer comprises greater than 30% styrene sulfonic acid monomer units and has a weight average molecular weight of less than 300,000, and more preferably 10,000 to 300,000. The weight ratio of the amount of the first polymer to the second polymer may range from 1:10 to 10:1, and more preferably from 30:70 to 70:30. If pectin is utilized the weight ratio of pectin to the polymer mixture may range from 1:10 to 10:1. In one embodiment the stabilizer comprises pectin and a polymer mixture of a first polymer comprising greater than 80% styrene sulfonic acid monomer units and-having a weight average molecular weight of greater than 500,000, and a second polymer comprising less than 30% styrene sulfonic acid monomer units and having a weight average molecular weight of less than 300,000.

The styrenesulfonic acid type polymer is a homopolymer (i.e., polystyrenesulfonic acid) or a copolymer comprising a repeating unit derived from styrenesulfonic acid. In the case that the styrenesulfonic acid type polymer is a copolymer, other repeating units are preferably derived from an ethylenic unsaturated compound such as acrylic acid, maleic anhydride, ethylene or an ethylene derivative. Examples of the copolymer include acrylic acid-styrenesulfonic acid copolymers, maleic anhydride-styrenesulfonic acid copolymers, acrylic ester styrenesulfonic acid copolymers, ethylene-styrenesulfonic acid copolymers, ethylene derivative-styrenesulfonic acid copolymers, styrene-styrenesulfonic acid copolymers, vinyl acetate-styrenesulfonic acid copolymers, vinyl pyrrolidone-styrenesulfonic acid copolymers and vinyl sulfonic acid-styrenesulfonic acid copolymers. Among them, acrylic acid-styrenesulfonic acid copolymers, maleic anhydride-styrenesulfonic acid copolymers, ethylene-styrenesulfonic acid copolymers, ethylene derivative-styrenesulfonic acid copolymers and styrene-styrenesulfonic acid copolymer are preferred.

The sulfo groups of the polymer may be in the form of either a free acid or a salt (including partial salts). Preferably the sulfo groups of the polymer are in the form of a salt. Examples of the salts include sodium salts, potassium salts and ammonium salts. Among them, sodium salts and potassium salts are preferred. In one embodiment the second polymer is a poly(styrenesulfonic acid-co-maleic acid) salt.

Preferably the microcapsules have a mean particle size of greater than 0.5 microns, and more preferably greater than 2.0 microns. It is also preferred that the microcapsules have a mean particle size of less than 20 microns, and more preferably less than 10 microns.

It is preferred that the total stabilizer concentration in the aqueous media is less than 10% by weight. More preferably the total stabilizer concentration in the aqueous media is less than 6% by weight, and most preferably the total stabilizer concentration in the aqueous media is less than 4% by weight.

In a preferred embodiment the microcapsules are photohardenable. In one embodiment the water immiscible material is a color precursor which can react with a developer material to form color.

In a preferred embodiment of the invention, the process of forming microcapsules comprises the steps of (1) mixing an organic liquid phase which comprises the hydrophobic liquid core material with an aqueous phase comprising a stabilizer to form a premix;
(2) homogenizing the premix by forcing the premix under pressure through a high pressure passage into a low pressure area to produce a microparticle dispersion, said microparticles having a mean size of greater than 1.0 micron;
(3) adding an encapsulating material at any time prior to step (4);
(4) curing the encapsulating material associated with the microparticles to form microcapsules.

The first step of the process is the mixing of an organic liquid phase comprising a hydrophobic core material with an aqueous phase comprising a stabilizer to form a premix. This step is preferably carried out in a mixing device which is capable of imparting intense agitation to the mixture. The mixing can be done in a batch process or in a continuous fashion. Any type of propeller mixers or ultrasonic mixers can be used in the batch process. The organic liquid phase and aqueous phase can also be fed to a mixer continuously by a dosing apparatus. Mixers that can be used include impingement mixers, stator rotor mixers, colloid mill mixers, and the like. To effectively practice the present invention, the volume ratio of the organic liquid phase to the aqueous phase is preferably less than 60:40, more preferably less than 50:50.

Any hydrophobic core materials can be used. If the hydrophobic core material is liquid it may itself form the organic liquid phase. If the hydrophobic core materials are solid, they can be dissolved in an organic solvent to form the organic liquid phase. Organic solvent can also be used to modulate the organic phase viscosity. Examples of useful organic solvents, preferably low boiling, include; propyl acetate, isopropyl acetate, ethyl acetate, acetone, methyl ethyl ketone, dichloroethane, methyl isobutyl ketone, isopropanol, isobutanol, toluene, xylene, dichloromethane, high boiling aromatic hydrdrocarbons, phthalate ester, cholorinated paraffins, alkylnaphthalenes, alkylated biphenyls, and the like. The hydrophobic core materials to be encapsulated can be dyestuff precursors such as leuco dyes, perfume oils, scents, flavors, foodstuffs, colorants, paints, catalysts, nutritional formulations for plants or animals, adhesives, paraffin oils, pharmaceuticals, insecticides, fungicides, herbicides and repellents. In one preferred embodiment the hydrophobic core material is a color precursor which can react with a developer to form color, such as a leuco dye. The sulfonated polystyrene polymer stabilizer used in the practice of the present invention is dissolved in the aqueous phase by methods known to those skilled in the art.

The second step of the process is the homogenizing of the premix by forcing the premix under pressure through a high pressure passage into a low pressure area to produce a microparticle dispersion having a mean size of greater than 1.0 micron. As for the high-pressure homogenizer which may be used in the present invention, it is considered that the dispersion into fine particles is generally achieved by dispersion forces such as (a) "shear force" generated at the passage of a dispersoid through a narrow slit under a high pressure at a high speed, and (b) "cavitation force" generated at the time of the release of the dispersoid from the high pressure so as to be under normal pressure. The high pressure passage may be, but is not limited to, a hole, a gap, a slit, a pipe or tube, or a channel. Generally the passage is narrower than the low pressure (low pressure includes normal atmospheric pressure) area in order to provide the pressure differential. The low pressure area may be, but is not limited to, a container, or a wider pipe, tube or channel. There are various configurations that can be used to force the premix under pressure through a high-pressure passage into a low-pressure area.

A typical high pressure homogenizer consists of a pump and a homogenizing valve. An example of such as apparatus has been described in U.S. Pat. No. 4,383,769, incorporated herein by reference. In such a case, the premix is forced through a narrow gap between a valve seat and a valve plate. Through the gap, the premix undergoes extremely rapid acceleration as well as an extreme drop in pressure. The pressure drop occurs in a very short time, for example, less than 50 microseconds, which produce a large amount of energy in the liquid. The high energy density produced in the premix causes the premix emulsion droplet to disrupt fairly uniformly into primary particles of less than 1 micron in size provided that the homogenization pressure is sufficiently high and that the organic phase has a viscosity of less than, for example, 200 cps. The primary particles then coalesce in a controlled manner to form particles having a mean size greater than 1.0 micron, and preferably greater than 2.0 microns. In the present invention, the homogenization pressure is preferably higher than 4000 psi, and more preferably higher than 5000 psi. Preferably the pressure differential between the high pressure passage and the low pressure area is greater than 2000 psi and more preferably the pressure differential is greater than 4000 psi. If the viscosity of the organic phase is high, for example, greater than 200 cps, a higher homogenization pressure is needed to disrupt the droplets of the premix to particles of less than 1 micron.

Another example of a suitable apparatus includes the Gauline homogenizer. By using this apparatus, the solution to be dispersed is transported under a high pressure and converted into a high-speed flow through a narrow slit on a cylinder surface, and the energy of the flow allows collision of the flow against the peripheral wall surface to achieve emulsification and dispersion. In order to increase the dispersion efficiency, some apparatuses are designed wherein a part of a high flow velocity is formed into a serrated shape to increase the frequency of collision. Apparatuses capable of dispersion under a higher pressure and at a higher flow velocity have been developed in recent years, and examples include Microfluidizer (manufactured by Microfluidex International Corporation) and Nanomizer (manufactured by Tokusho Kika Kogyo KK).

Examples of other dispersing apparatus which can be suitably used in the present invention include Microfluidizer M-110S-EH (with G10Z interaction chamber), M-110Y (with H10Z interaction chamber), M-140K (with G10Z interaction chamber), HC-5000 (with L30Z or H230Z interaction chamber) and HC-8000 (with E230Z or L30Z interaction chamber), all manufactured by Microfluidex International Corporation. By using these apparatuses, the premix is transported under a positive pressure by means of a high-pressure pump or the like into the pipeline, and the solution is passed though a narrow slit provided inside the pipeline to apply a desired pressure. Then, the pressure in the pipeline is rapidly released to the atmospheric pressure to apply a rapid pressure change to the dispersion to obtain an optimal dispersion for use in the present invention.

There are a number of ways that can be used to measure the microcapsule size and size distribution. A preferred way is to use the Coulter Multisizer manufactured, for example, by Beckman. In the present invention, the size distribution index of microcapsules is measured by the ratio of the volume average size to the number average size. Preferably the microcapsules of the invention has a size distribution index of less than 2, more preferably less than 1.8, most preferably less than 1.6.

The types of encapsulating materials (also known as wall-forming materials) useful for the invention depend on the intended application, which in turn dictates the releasing mechanism of the encapsulated core materials. The capsule wall can be formed by a coacervation process utilizing a hydrophilic wall-forming material described in U.S. Pat. Nos. 2,800,457 and 2,800,458; an interfacial polymerization process as described in U.S. Pat. No. 3,287,154, U.K. Patent 990,443, and JP-B Nos. 38-19574, 42-446, and 42-771; a polymer deposition process as described in U.S. Pat. Nos. 3,418,250 and 3,660,304; a process utilizing isocyanate-polyol wall forming material such as described in U.S. Pat. No. 3,796,669; a process utilizing an isocyanate wall forming material such as described in U.S. Pat. No. 3,914,511; a process utilizing urea-formaldehyde and urea-formaldehyde-resorcinol wall forming materials such as described in U.S. Pat. Nos. 4,001,140, 4,087,376, and 4,089,802; a process utilizing wall-forming materials such as a melamine-formaldehyde resin and hydroxypropylcellulose such as described in U.S. Pat. No. 4,025,455; an in-situ method utilizing a polymerization of monomers as described in JP-B No. 36-9168 and JP-A No. 51-9079; a method utilizing electrolytic dispersion cooling such as described in U. K. Patents 952,807 and 965,074; and a spray-drying method auch as described in U.S. Pat. No. 3,111,407 and U. K. Patent 930,442, all incorporated herein by reference.

The encapsulating method is not limited to the methods listed above. However, for use in the imaging material of the present invention, it is particularly preferable to employ the interfacial polymerization method wherein the reactants that form the capsule wall polymers, the encapsulating materials, are added to the liquid organic phase prior to forming of the premix (inside the microparticle) or to the mixture after the homogenization step (outside of the droplets). Examples of the capsule wall polymers (encapsulating materials) include polyurethane, polyurea, polyamide, polyester, polycarbonate, urea/formaldehyde resins, melamine resins, polystyrene, styrene/methacrylate copolymers, styrene/acrylate copolymers, and so on. Among these substances, polyurethane, polyurea, polyamide, polyester, and polycarbonate are preferable, and polyurethane and polyurea are particularly preferable. The above-listed polymeric substances may be used in combinations of two or more kinds.

As noted above the encapsulating material may be added at any time prior to the curing step. It is preferably added prior to or during the formation of the premix, after the homogenizing step, or at both times. The encapsulating material may the same or different when it is added at two different times. A mixture of encapsulated materials may be utilized at any of the steps noted above. The encapsulation material is cured using any suitable method, such as heat, pH change or a chemical reaction. In one embodiment the encapsulation material is cured by a condensation polymerization reaction. In a typical process, a wall forming material or a reactant such as a polyisocyanate, optionally together with a chain extender, is added to the liquid organic phase prior to forming the premix, and a polyamine soluble in the aqueous phase is added to the homogenized mixture. A polyurea wall is formed by heating the mixture for a period of time. Optionally a second wall forming material can be added during or after the first wall formation. For example, melamine formaldehyde precondensate can be added to the above mixture to form a melamine-formaldehyde shell by controlling pH and reaction temperature.

The invention further comprises an imaging element comprising a support having a light sensitive and heat developable image forming unit or a light sensitive and pressure developable image forming unit provided thereon, wherein the image forming unit comprises microcapsules made by the method of the invention. In a preferred embodiment the element comprises an image forming unit which is light sensitive and pressure developable i.e. it is exposed by light and developed by applying pressure. The image forming unit of the various element types may comprise one layer or more than one layer. At least one layer comprises a color-forming component that is preferably enclosed in the microcapsule of the invention. At least one layer comprises a color developer. The microcapsules and the developer may be in the same layer or in different layers. Preferably the microcapsules are light sensitive. More preferably the microcapsules are both light and pressure sensitive.

Preferably the microcapsules are photohardenable. The hydrophobic core of the light sensitive microcapsules of the invention comprises a color-forming component, a polymerizable compound, and a photopolymerization initiator. In the light sensitive and pressure developable imaging element, exposure to light according to a desired image causes the polymerizable compound present inside the microcapsules to harden the microcapsule interior by a polymerization reaction due to the radical generated from the photopolymerization initiator upon exposure so that a latent image in a desired shape is formed. That is, in the exposed portions, the color-forming reaction with the developer particles present outside the microcapsules is inhibited. Next, when pressure is applied to the imaging element, the microcapsules which have not hardened (the unexposed microcapsules) are broken which cause the color forming component to move within the unexposed area to react with the developer particles to develop a color. Accordingly, the light sensitive and pressure developable image-imaging element is a positive-type, light sensitive and pressure developable imaging element in which the image formation is performed such that color formation is not made in exposed portions but color formation is made in the unexposed portions that do not harden.

In a preferred embodiment of the invention, the color-forming component is mixed together with a photopolymerization composition to form the microcapsule core, or microcapsule internal phase. The microcapsule shell or the microcapsule wall material is a polyurea, or polyurethane-urea. The microcapsule shell or the microcapsule wall material comprises a polyurea shell or a polyurethane-urea shell and a melamine-formaldehyde or urea-formaldehyde shell.

Preferably the microcapsule containing the color-forming component is prepared by the steps of dissolving the color-forming component (hydrophobic core) and a wall forming material such as a polyisocyanate in an auxiliary organic solvent such as ethyl acetate, or a thermal solvent, to form a solution, mixing the solution with an aqueous phase comprising a stabilizer to form a premix; homogenizing the premix by forcing the premix under pressure through a high pressure passage into a low pressure area to produce a microparticle dispersion, adding a curing agent to react with the wall forming material; and curing the wall forming materials at an elevated temperature to form micro capsules.

If it is desirable to form a second shell, an aqueous solution of melamine and formaldehyde or a precondensate is added to the above microcapsule dispersion. The melamine-formaldehyde shell is formed by raising the temperature of the resulting mixture at neutral or acidic pH, e.g. pH of 7 or less. The temperature of encapsulation is maintained at about 20 to 95° C., preferably about 30 to 85° C., ad more preferably about 45 to 80° C.

The mean particle diameter of the microcapsules for use in the imaging material of the present invention is preferably 20 $\mu$m or less, more preferably 10 $\mu$m or less and most preferably 6 $\mu$m or less from the standpoint of obtaining high resolution. The mean particle diameter is preferably 1.0 $\mu$m or greater because, if the average particle diameter of the microcapsules is too small, the surface area per unit amount of the solid components becomes larger and a lager amount of wall-forming materials is required.

The color-forming components useful for the practice of the invention include an electron-donating, colorless dye such that the dye reacts with a developer (i.e. compound B, compound C, or compound E) to develop a color. Specific examples of these color-forming components include those described in Chemistry and Applications of Leuco Dye, Edited by Ramaiah Muthyala, Plenum Publishing Corporation, 1997. Representative examples of such color formers include substantially colorless compounds having in their partial skeleton a lactone, a lactam, a sultone, a spiropyran, an ester or an amido structure. More specifically, examples include triarylmethane compounds, bisphenylmethane compounds, xanthene compounds, thiazine compounds and spiropyran compounds. Typical examples of the color formers include Crystal Violet lactone, benzoyl leuco methylene blue, Malachite Green Lactone, p-nitrobenzoyl leuco methylene blue, 3-dialkylamino-7-dialkylamino-fluoran, 3-methyl-2,2'-spirobi(benzo-f-chrome), 3,3-bis(p-dimethylaminophenyl)phthalide, 3-(p-dimethylaminophenyl)-3-(1,2 dimethylindole-3-yl)phthalide, 3-(p-dimethylaminophenyl)-3-(2-methylindole-3-yl)phthalide, 3-(p-dimethylaminophenyl)-3-(2-phenylindole-3-yl)phthalide, 3,3-bis(1,2-dimethylindole-3-yl)-5-dimethylaminophthalide, 3,3-bis-(1,2-dimethylindole-3-yl) 6-dimethylaminophthalide, 3,3-bis-(9-ethylcarbazole-3-yl)-5-dimethylaminophthalide, 3,3-bix(2-phenylindole-3-yl)-5-dimethylaminophthalide, 3-p-dimethylaminophenyl-3-(1-methylpyrrole-2-yl)-6-dimethylaminophthalide, 4,4'-bis-dimethylaminobenzhydrin benzyl ether, N-halophenyl leuco Auramine, N-2,4,5-trichlorophenyl leuco Auramine, Rhodamine-B-anilinolactam, Thodamine-(p-nitroanilino) lactam, Rhodamine-B-(p-chloroanilino)lactam, 3-dimethylamino-6-methoxyfluoran, 3-diethylamino-7-methoxyfluoran, 3-diethylamino- 7-chloro-6-methylfluoroan, 3-diethylamino-6-methyl-7-anilinofluoran, 3-diethylamino-7-(acetylmethylamino)fluoran, 3-diethylamino-7-(dibenzylamino)fluoran, 3-diethylamino-7-(methylbenzylamino) fluoran, 3-diethylamino-7-(chloroethylmethylamino) fluoran, 3-diethylamino-7-(diethylamino)fluoran, 3-methyl-spiro-dinaphthopyran, 3,3'-dichloro-spiro-dinaphthopyran, 3-benzyl-spiro-dinaphthopyran, 3-methyl-naphtho-(3-methoxybenzo)-spiropyran, 3-propyl-spirodibenzoidipyran, etc. Mixtures of these color precursors can be used if desired. Also useful in the present invention are the fluoran color formers disclosed in U.S. Pat. No. 3,920,510, which is incorporated by reference. In addition to the foregoing dye precursors, fluoran compounds such as disclosed in U.S. Pat. No. 3,920,510 can be used. In addition, organic compounds capable of reacting with heavy metal salts to give colored metal complexes, chelates or salts can be adapted for use in the present invention.

The polymerizable compound is an addition polymerizable compound selected from among the compounds having at least one, preferably two or more, ethylenically unsaturated bond at terminals. Such compounds are well known in the industry and they can be used in the present invention with no particular limitation. Such compounds have, for example, the chemical form of a monomer, a prepolymer, i.e., a dimer, a trimer, and an oligomer or a mixture and a copolymer of them. As examples of monomers and copolymers thereof, unsaturated carboxylic acids (e.g., acrylic acid, methacrylic acid, itaconic acid; crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used. The addition reaction products of unsaturated carboxylic esters and amides having electrophilic substituents such as an isocyanato group and an epoxy group with monofunctional or polyfunctional alcohols, amines and thiols, and the substitution reaction products of unsaturated carboxylic esters and amides having releasable substituents such as a halogen group and a tosyloxy group with monofunctional or polyfunctional alcohols, amines and thiols are also preferably used. As another example, it is also possible to use compounds replaced with unsaturated phosphonic acid, styrene, vinyl ether, etc., in place of the above-unsaturated carboxylic acids.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, etc. As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, and bis[p-(3-methacryloxy-2-hydroxy-propoxy)phenyl] dimethylmethane, bis[p-(methacryloxyethoxy)-phenyl] dimethylmethane. As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. As crotonates, examples include ethylene glycol dicrotonate, tetramethylene glycol dicrotonate, pentaerythritol dicrotonate, and sorbitol tetradicrotonate. As isocrotonates, examples include ethylene glycol diisocrotonate, pentaerythritol diisocrotonate, and sorbitol tetraisocrotonate. As maleates, examples include ethylene glycol dimaleate, triethylene glycol dimaleate, pentaerythritol dimaleate, and sorbitol tetramaleate. Further, the mixtures of the above-described ester monomers can also be used. Further, specific examples of amide monomers of aliphatic polyhydric amine compounds and unsaturated carboxylic acids include methylenebis acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, and xylylenebis-methacrylamide.

Further, urethane-based addition polymerizable compounds which are obtained by the addition reaction of an isocyanate and a hydroxyl group are also preferably used in the present invention. A specific example is a vinyl urethane compound having two or more polymerizable vinyl groups in one molecule, which is obtained by the addition of a vinyl monomer having a hydroxyl group represented by the following formula (V) to a polyisocyanate compound having two or more isocyanate groups in one molecule.

$$CH_2{=}C(R)COOCH_2CH(R')OH$$

wherein R and R' each represents H or CH 3.

Other examples include polyfunctional acrylates and methacrylates, such as polyester acrylates, and epoxy acrylates obtained by reacting epoxy resins with (meth)acrylic acids. Moreover, photo-curable monomers and oligomers listed in Sartomer Product Catalog by Sartomer Company Inc. (1999) can be used as well.

The details in usage of the addition polymerizable compound, e.g., what structure is to be used, whether the compound is to be used alone or in combination, or what an amount is to be used, can be optionally set up according to the final design of the characteristics of the photosensitive material. For example, the conditions are selected from the following viewpoint. For the photosensitive speed, a structure containing many unsaturated groups per molecule is preferred and in many cases bifunctional or more functional groups are preferred. For increasing the strength of an image part, i.e., a cured film, trifunctional or more functional groups are preferred. It is effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but may not be preferred from the point of development speed and precipitation in a developing solution. The selection and usage of the addition polymerizable compound are important factors for compatibility with other components (e.g., a binder polymer, an initiator, a colorant, etc.) in the photopolymerization composition and for dispersibility. For example, sometimes compatibility can be improved by using a low purity compound or two or more compounds in combination. Further, it is also possible to select a compound having specific structure for the purpose of improving the adhesion property of a support and an overcoat layer. Concerning the compounding ratio of the addition polymerizable compound in a photopolymerization composition, the higher the amount, the higher the sensitivity. But, too large an amount sometimes results in disadvantageous phase separation, problems in the manufacturing process due to the stickiness of the photopolymerization composition (e.g., manufacturing failure resulting from the transfer and adhesion of the photosensitive material components), and precipitation from a developing solution. The addition polymerizable compound may be used alone or in combination of two or more. In addition, appropriate structure, compounding ratio and addition amount of the addition polymerizable compound can be arbitrarily selected taking into consideration the degree of polymerization hindrance due to oxygen, resolving power, fogging characteristic, refractive index variation and surface adhesion. Further, the layer constitution and the coating method of undercoating and overcoating can be performed according to circumstances.

Various photoinitiators can be selected for use in the above-described imaging systems. However by far the most useful photoinitators consist of an organic dye and an organic borate salt such as disclosed in U.S. Pat. Nos. 5,112,752; 5,100,755; 5,057,393; 4,865,942; 4,842,980; 4,800,149; 4,772,530 and 4,772,541. The photoinitiator is preferably used in combination with a disulfide coinitiator as described in U.S. Pat. No. 5,230,982 and an autoxidizer which is capable of consuming oxygen in a free radical chain process.

The amount of organic dye to be used is preferably in the range of from 0.1 to 5% by weight based on the total weight of the photoplymerization composition, preferably from 0.2 to 3% by weight. The amount of borate compound contained in the photopolymerization composition of the invention is preferably from 0.1% to 20% by weight based on the total amount of photopolymerization composition, more preferably from 0.3 to 5% by weight, and most preferably from 0.3% to 2% by weight.

The ratio between the organic dye and organoborate salt is important from the standpoint of obtaining high sensitivity and sufficient decolorization by the irradiation of light in the fixing step of the recording process described later. The weight ratio of the organic dye to the organoborate salt is preferably in the range of from 2/1 to 1/50, more preferably less than 1/1 to 1/20, most preferably from 1/1 to 1/10.

The organic dyes for use in the present invention may be suitably selected from conventionally known compounds having a maximum absorption wavelength falling within a range of 300 to 1000 nm. High sensitivity can be achieved by selecting a desired dye having the wavelength range within described above and adjusting the sensitive wavelength to match the light source to be used. Also, it is possible to suitably select a light source such as blue, green, or red, or infrared LED (light emitting diode), solid state laser, OLED (organic light emitting diode) or laser, or the like for use in image-wise exposure to light.

Specific examples of the organic dyes include 3-ketocoumarin compounds, thiopyrylium salts, naphthothiazolemerocyanine compounds, merocyanine compounds, and merocyanine dyes containing thiobarbituric acid, hemioxanole dyes, and cyanine, hemicyanine, and merocyanine dyes having indolenine nuclei. Other examples of the organic dyes include the dyes described in Chemistry of Functional Dyes (1981, CMC Publishing Co., Ltd., pp. 393–416) and Coloring Materials (60 [4], 212–224, 1987). Specific examples of these organic dyes include cationic methine dyes, cationic carbonium dyes, cationic quinoimine dyes, cationic indoline dyes, and cationic styryl dyes. Examples of the above-mentioned dyes include keto dyes such as coumarin dyes (including ketocoumarin and sulfonocoumarin), merostyryl dyes, oxonol dyes, and hemioxonol dyes; nonketo dyes such as nonketopolymethine dyes, triarylmethane dyes, xanthene dyes, anthracene dyes, rhodamine dyes, acridine dyes, aniline dyes, and azo dyes; nonketopolymethine dyes such as azomethine dyes, cyanine dyes, carbocyanine dyes, dicarbocyanine dyes, tricarbocyanine dyes, hemicyanine dyes, and styryl dyes; quinoneimine dyes such as azine dyes, oxazine dyes, thiazine dyes, quinoline dyes, and thiazole dyes.

Preferably the organic dye useful for the invention is a cationic dye-borate anion complex formed from a cationic dye and an anionic organic borate. The cationic dye absorbs light having a maximum absorption wavelength falling within a range from 300 to 1000 nm and the anionic borate has four R groups, of which three R groups each represents an aryl group which may have a substitute, and one R group is an alkyl group, or a substituted alkyl group. Such cationic dye-borate anion complexes have been disclosed in U.S. Pat. Nos. 5,112,752, 5,100,755, 5,075,393, 4,865,942, 4,842,980, 4,800,149, 4,772,530, and 4,772,541, which are incorporated herein by reference.

When the cationic dye-borate anion complex is used as the organic dye in the photopolymerization compositions of the invention, it does not require to use the organoborate salt. However, to increase the photopolymerization sensitivity and to reduce the cationic dye stain, it is prefered to use an organoborate salt in combination with the cationic dye-borate complex. The organic dye can be used singly or in combination.

Specific examples of the above-mentioned water insoluble phenols are given below. However, it should be noted that the present invention is not limited to these examples.

Dye-1
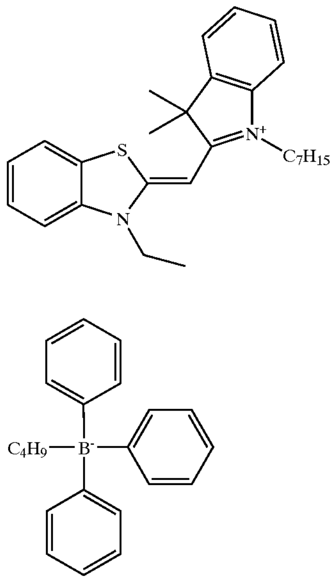
Dye-2
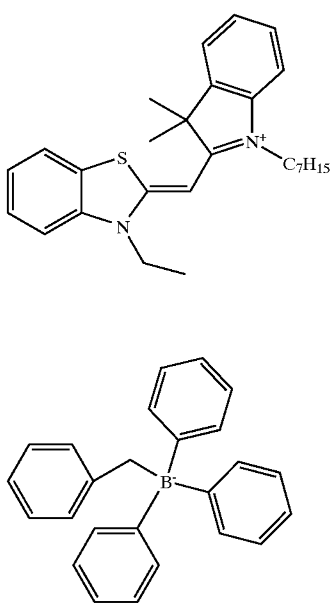
Dye-3
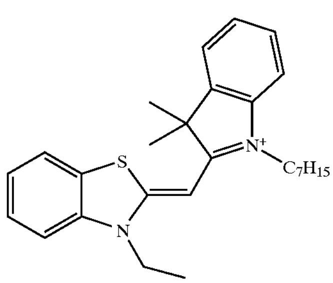
-continued
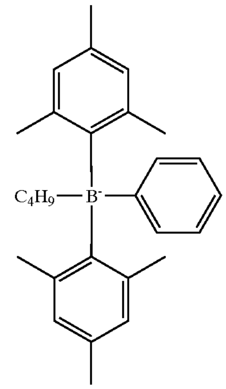
Dye-4
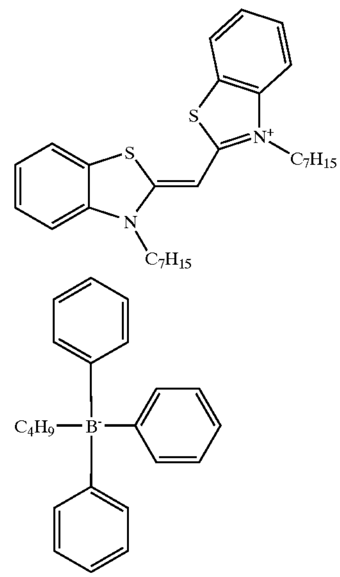
Dye-5
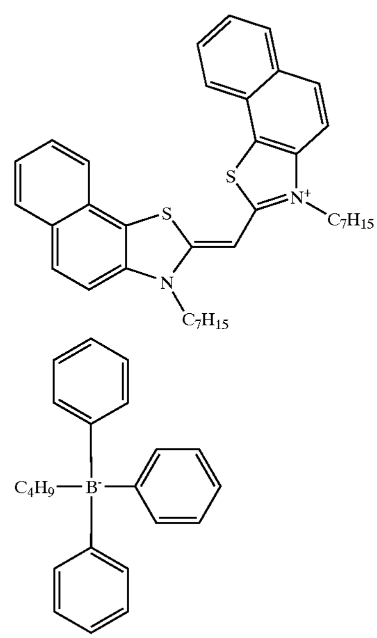

-continued
Dye-6
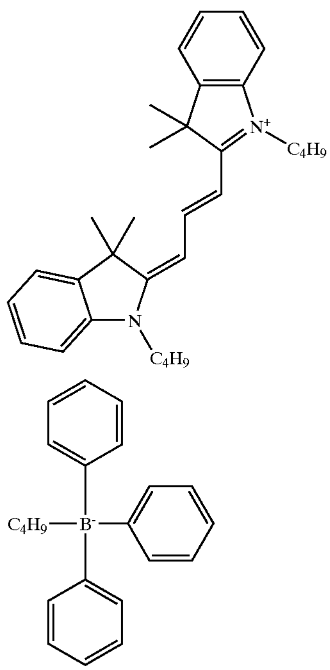
Dye-7
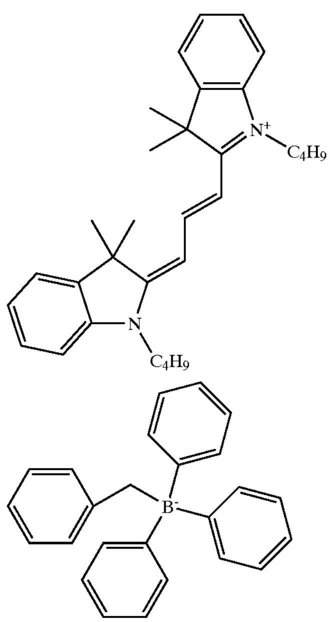
Dye-8
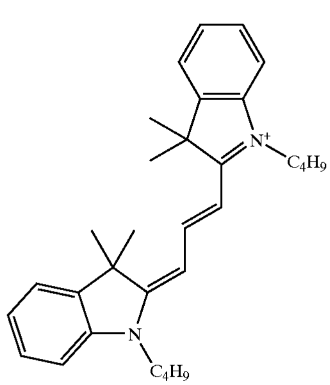
-continued
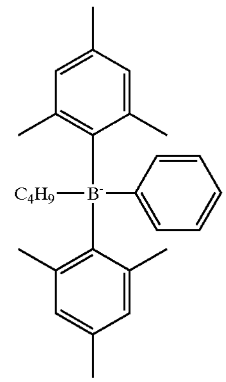
Dye-9
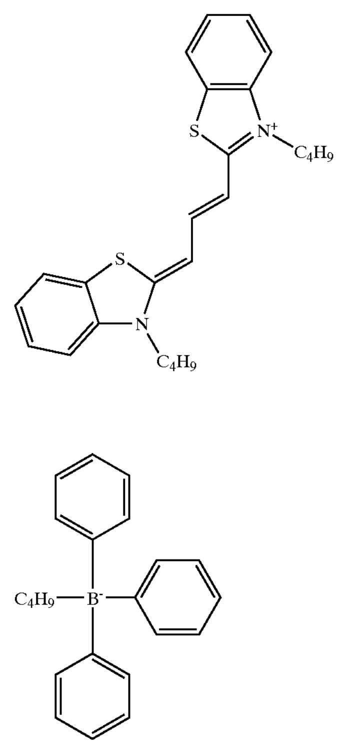
Dye-10
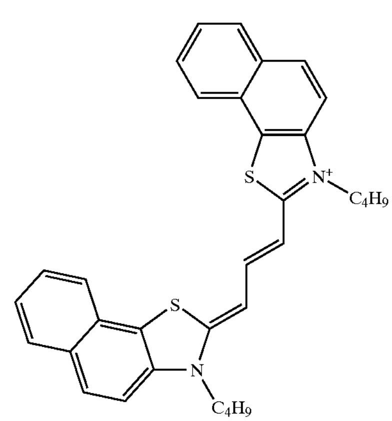

-continued
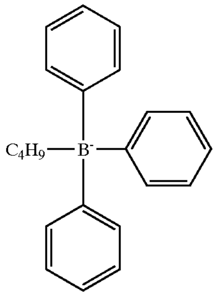
Dye-11
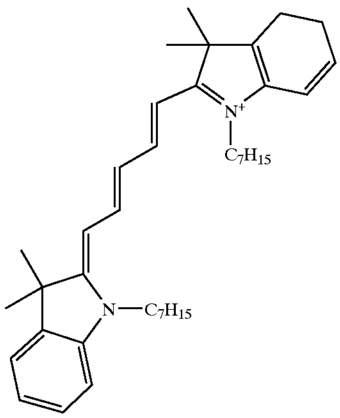
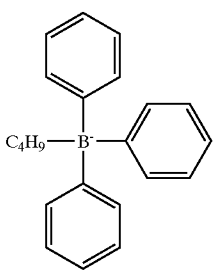
Dye-12
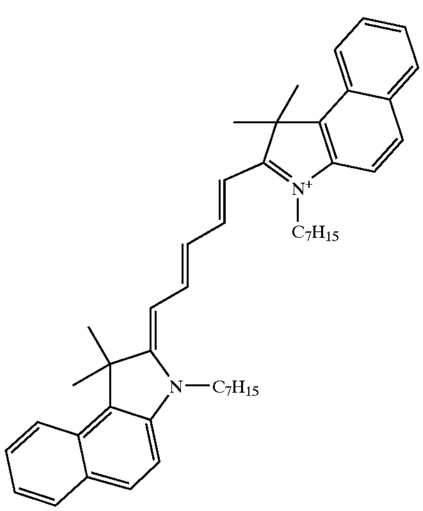
-continued
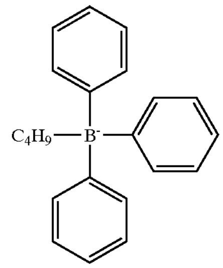
Dye-13
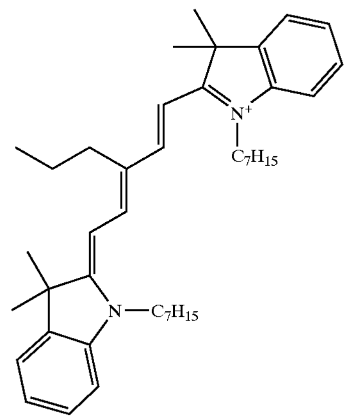
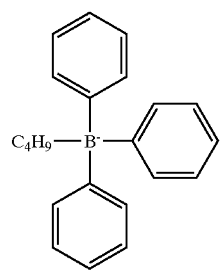
Dye-14
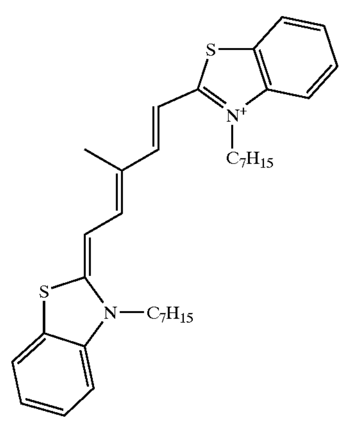
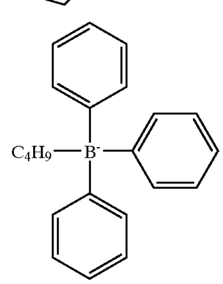

-continued
Dye-15
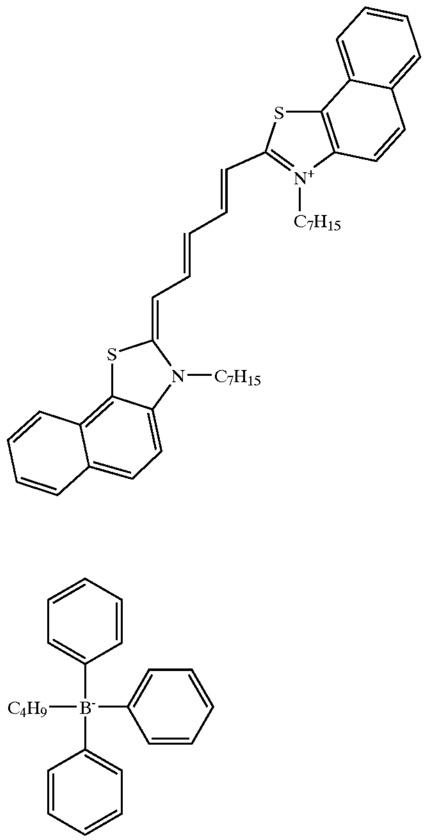
Dye-16
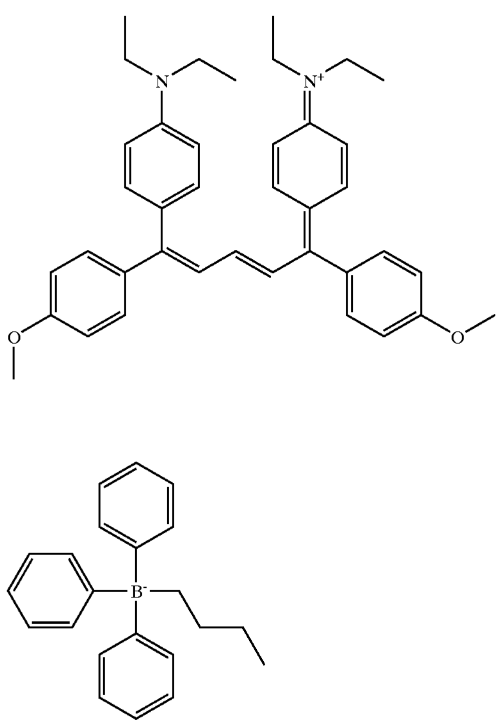
-continued
Dye-17
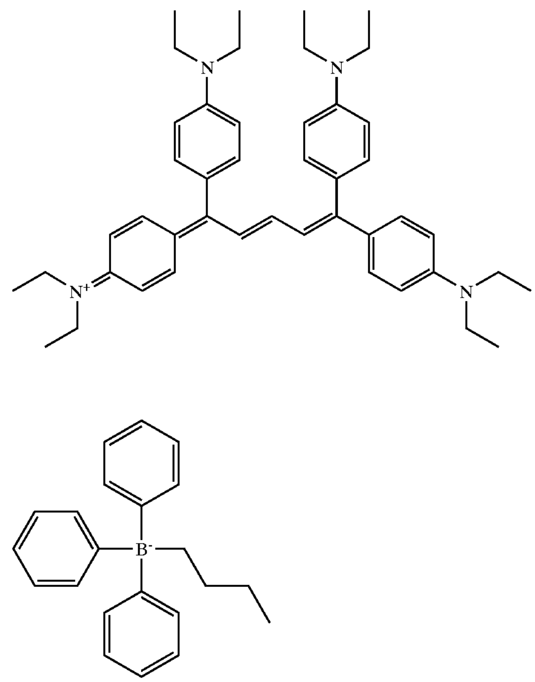
Dye-18
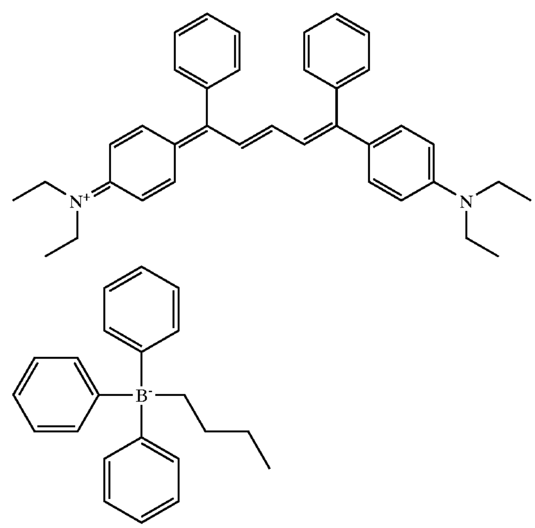
Dye-19
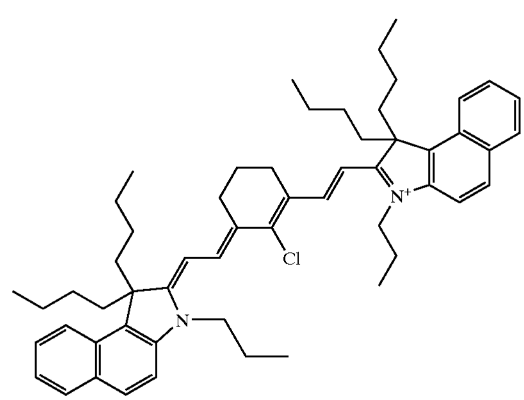

-continued

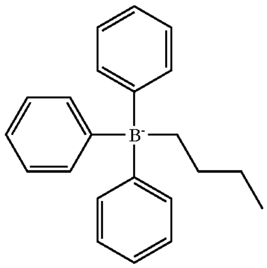

The borate salt useful for the photosensitive composition of the present invention is represented by the following general formula (I).

$$[BR_4]^-Z^+ \qquad [I]$$

where Z represents a group capable of forming cation and is not light sensitive, and $[BR_4]^-$ is a borate compound having four R groups which are selected from an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof. Plural Rs may be the same as or different from each other. In addition, two or more of these groups may join together directly or via a substituent and form a boron-containing heterocycle. $Z^+$ does not absorb light and represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se.

Specific examples of the above-mentioned borate salts are given below. However, it should be noted that the present invention is not limited to these examples.

BS-1

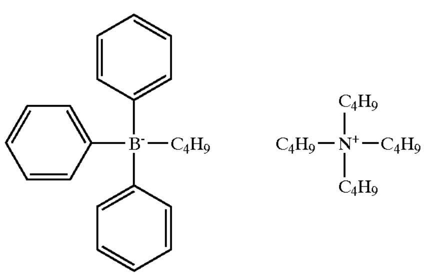

BS-2

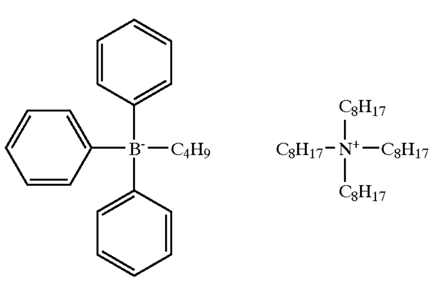

-continued

BS-3

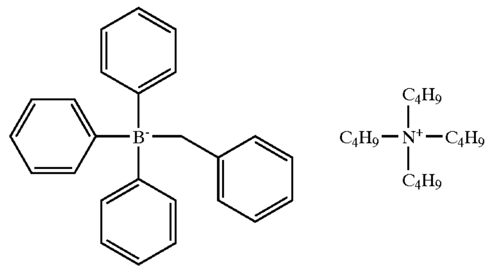

BS-4

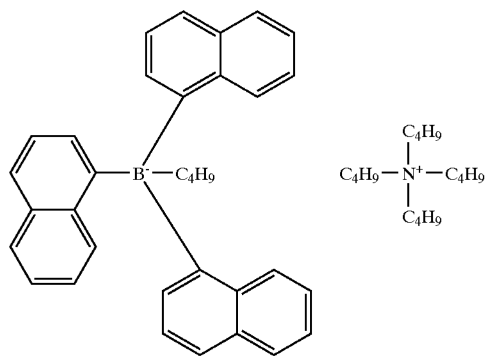

BS-5

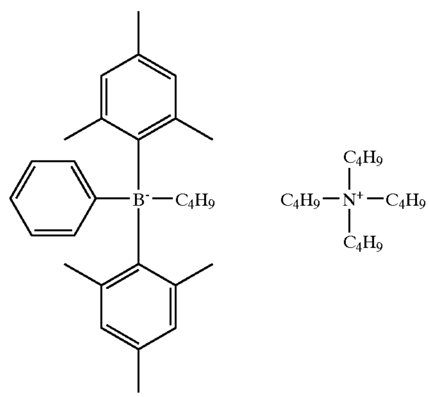

BS-6

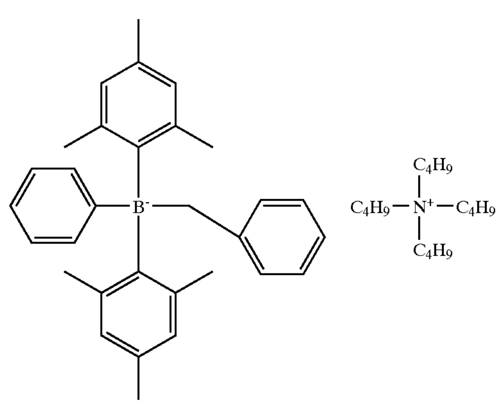

-continued
BS-7
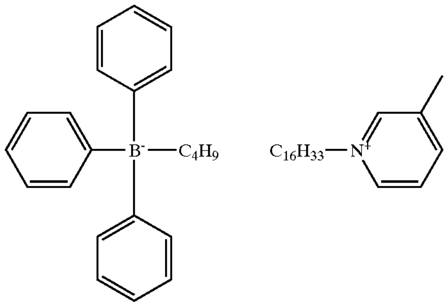
BS-8
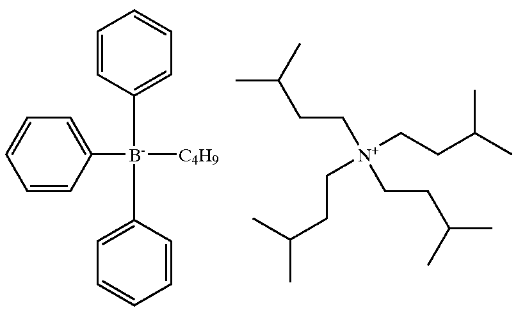
BS-9
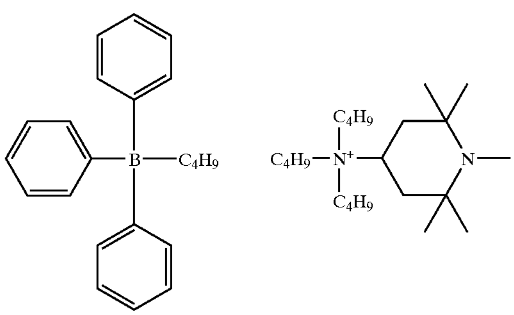
BS-10
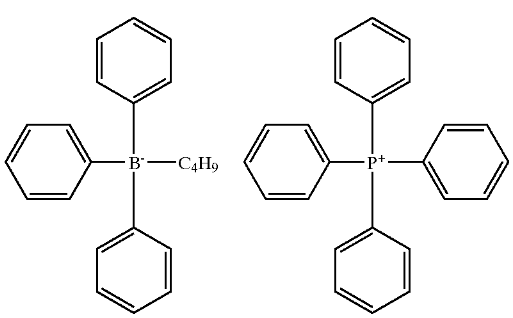
-continued
BS-11
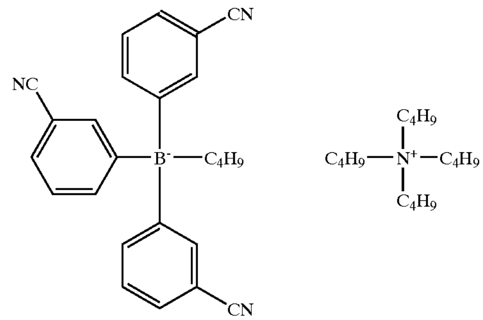
BS-12
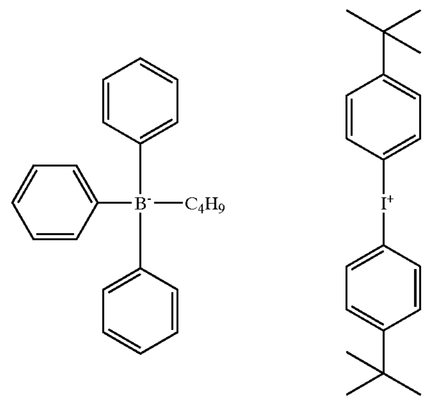
BS-13
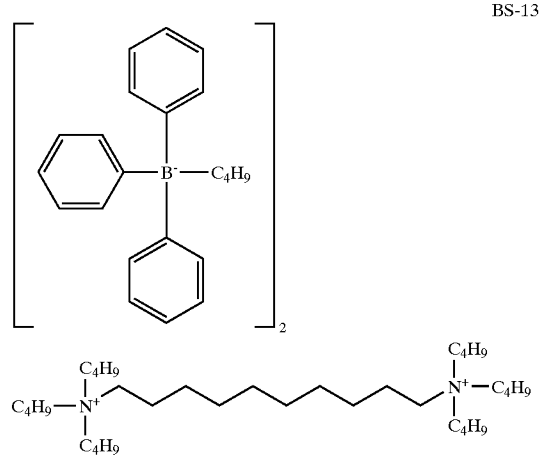
BS-14
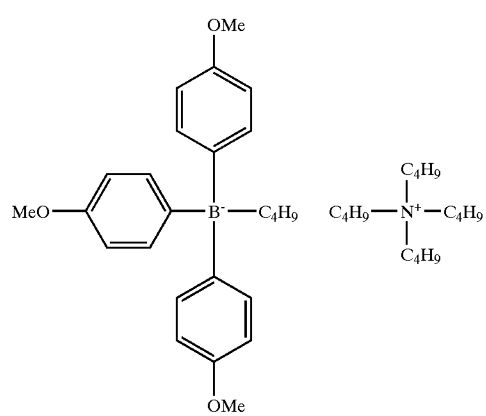

-continued

BS-15

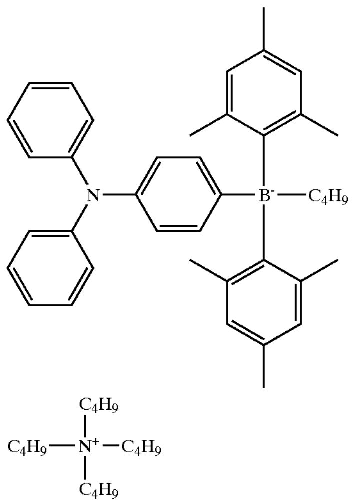

BS-16

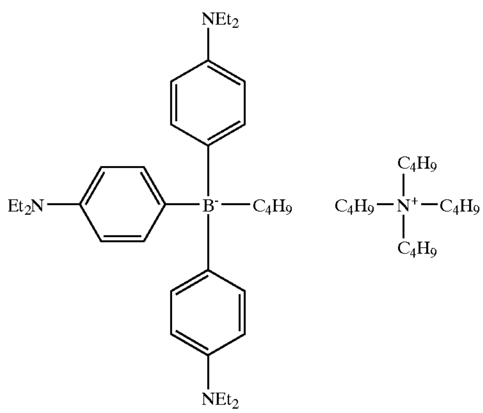

BS-17

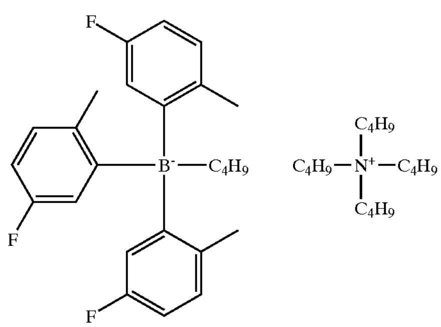

Various additives can be used together with the photoinitiator system to affect the polymerization rate. For example, a reducing agent such as an oxygen scavenger or a chain-transfer aid of an active hydrogen donor, or other compound can be used to accelerate the polymerization. An oxygen scavenger is also known as an autoxidizer and is capable of consuming oxygen in a free radical chain process. Examples of useful autoxidizers are N,N-dialkylanilines. Examples of preferred N,N-dialkylanilines are dialkylanilines substituted in one or more of the ortho-, meta-, or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo. Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylaniline, N,N-dimethylthioanicidine, 4-amino-N,N-dimethylaniline, 3-hydroxy-N,N-dimethylaniline, N,N,N',N'-tetramethyl-1,4-dianiline, 4-acetamido-N,N-dimethylaniline, 2,6-diisopropyl-N,N-dimethylaniline (DIDMA), 2,6-diethyl-N,N-dimethylaniline, N,N, 2,4,6-pentamethylaniline (PMA) and p-t-butyl-N,N-dimethylaniline. In accordance with another aspect of the invention, the dye borate photoinitiator is used in combination with a disulfide coinitiator.

Examples of useful disulfides are described in U.S. Pat. No. 5,230,982 which is incorporated herein by reference. Two of the most preferred disulfides are mercaptobenzothiazo-2-yl disulfide and 6-ethoxymercaptobenzothiazol-2-yl disulfide. By using these disulfides as described in the referenced patent, the amount of the photoinitiators used in the microcapsules can be reduced to levels such that the background coloration or residual stain can be reduced significantly. At these low levels, the low-density image area coloration of the imaging layer does not detract unacceptably from the quality of the image. In addition, thiols, thioketones, trihalomethyl compounds, lophine dimer compounds, iodonium salts, sulfonium salts, azinium salts, organic peroxides, and azides, are examples of compunds useful as polymerization accelerators.

Other additives which can be incorporated into the photopolymerization composition of the invention include various ultraviolet ray absorbers and hindered amine light stabilizers, photostabilizers as described in detail by J. F. Rabek in "Photostabilization of Polymers, Principles and Applications" published by Elsevier Applied Science in 1990.

The substantially colorless compound, which reacts with the color-forming component to develop a color, may or may not have a polymerizable group. Color developers useful for the invention include inorganic solids such as clay and attapulgite, substituted phenols and biphenols, polyvalent metal salts of modified p-substituted phenol-formaldehyde resins, and polyvalent metal salts of aromatic carboxylic acids. Preferably the color developers used to practice of the invention are metal salts of modified p-substituted phenol-formaldehyde resins and polyvalent metal salts of aromatic carboxylic acid derivatives such as multivalent polyvalent metal salts of 3,5-disubstituted salicylic acid derivatives or multivalent polyvalent metal salts of a salicylic acid resin obtained by reacting salicylates with styrene.

In a most preferred embodiment of the invention, the color developer is a polyvalent metal salt of salicylic acid/styrene copolymer developer which comprises multivalent salt of a salicylic acid derivative and a styrenic compound. Specific examples of the salicylic acid derivative include, but not limited to, salicylic acid, 3-methylsalicylic acid, 6-ethylsalicylic acid, 5-isopropylsalicylic acid, 5-sec-butylsalicylic acid, 5-tert-butylsalicylic acid, 5-tert-amylsalicylic acid, 5-cyclohexylsalicylic acid, 5-n octylsalicylic acid, 5-tert-octylsalicylic acid, 5-isononylsalicylic acid, 3-isododecylsalicylic acid, 5-isododecylsalicylic acid, 5isopentadecylsalicylic acid, 4-methoxysalicylic acid, 6-methoxysalicylic acid, 5-ethoxysalicylic acid, 6-isopropoxysalicylic acid, 4-n-hexyloxylsalicylic acid, 4-n-decyloxylsalicylic acid, 3,5-di-tert butylsalicylic acid, 3,5-di-tert-octylsalicylic acid, 3,5-diisononylsalicylic acid, 3,5-diisododecylsalicylic acid, 3-methyl-5-tert-nonylsalicylic acid, 3-tert-butyl-5-isononylsalicylic acid, 3-isononyl-5-tert-butylsalicylic acid, 3-isododecyl-5-tert-butylsalicylic acid, 3isononyl-5-tert-amylsalicylic acid, 3-isononyl-5-tert-octylsalicylic acid, 3-isononyl-6-methylsalicylic acid, 3-isododecyl-6-methylsalicylic acid, 3-sec-octyl-5-methylsalicylic acid, 3-isononyl-5-phenylsalicylic acid, 3-phenyl-5-isononylsalicylic acid, 3-methyl-5-α-methylbenzyl)salicylic acid, 3-methyl-5-(α,α-dimethylbenzyl)salicylic acid, 3-isononyl-5-(α-methylbenzyl)salicylic acid, 3-(α-methylbenzyl)-5-tert-butylsalicylic acid, 3-benzylsalicylic acid, 5-benzylsalicylic acid, 3-α-methylbenzyl)salicylic acid, 5-(α-methylbenzyl) salicylic acid, 3-(α,α-dimethylbenzyl)salicylic acid, 4-(α,α-dimethylbenzyl)salicylic acid, 5-(α,α-dimethylbenzyl)salicylic acid, 3,5-di(α-methylbenzyl)salicylic acid, 3,5-di(α,α-dimethylbenzyl)salicylic acid, 3-(α-methylbenzyl)-5-(α,α-dimethylbenzyl)salicylic acid, 3-(1',3'-diphenylbutyl) salicylic acid, 5(1',3'-diphenylbutyl)salicylic acid, 3-[α-methyl-4'-(α'-methylbenzyl)benzyl]-salicylic acid, 5-[α-methyl-4'-(α'-methylbenzyl)benzyl]-salicylic acid, 3-(α-methylbenzyl)-5-(1',3'-diphenyl-butyl)salicylic acid, 3-(1',3'-diphenylbutyl)-5-α-methylbenzyl)salicylic acid, 3-phenylsalicylic acid, 5-phenylsalicylic acid, 3-α-methyl-benzyl)-5-phenylsalicylic acid, 3-(α,α-dimethylbenzyl)-5-phenylsalicylic acid, 3-phenyl-5-(α-methylbenzyl) salicylic acid, 5-(4'-methylphenyl)salicylic acid, 5-(4'-methoxyphenyl) salicylic acid, 5-fluorosalicylic acid, 3-chlorosalicylic acid, 4chlorosalicylic acid, 5-chlorosalicylic acid, 5-bromosalicylic acid, 3-chloro- 5-(α-methylbenzyl)salicylic acid, 3-(α-methylbenzyl)-5-chlorosalicylic acid, and the like. Specific examples of the styrenic compound include, but not limited to, styrene, o-methylstyrene, m-methylstyrene, p-methylstyrene, o-ethylstyrene, p-ethylstyrene, o-isopropylstyrene, m-isopropylstyrene, p-isopropylstyrene, p-ter-butylstyrene, and α-methylstyrene, divinylbenzene, and styrene dimmers having the chemical formula:

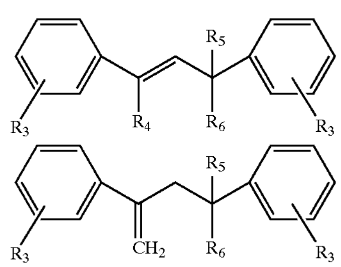

Wherein $R_3$ is a hydrogen or an alkyl group having 1 to 4 carbon atoms, and $R_4$ to $R_6$ represent a hydrogen or a methyl group.

There are many processes known in the art for making salicylic acid/styrene compounds. For example the multivalent polyvalent metal salt of salicylic acid resin can be produced by reacting salicylic acid with a benzyl alcohol derivative at elevated temperature as disclosed in U.S. Pat. No. 4,754,063. Or they can be produced by reacting salicylic acid with a styrene derivative at elevated temperature as disclosed in U.S. Pat. No. 4,929,710, or reacting salicylate ester with a styrene derivative at low temperature as disclosed in U.S. Pat. No. 4,952,648. Some of the processes form small molecules having a ratio of styrene to salicylic acid of 1:1 to 2:1. Others result in a mixture of copolymers having a ratio of styrene to salicylic acid of 1:1 to very large molecules with a molecular weight of 10,000 or more. The developer composition depends on the stoichiometry of the styrene derivative and salicylate used in the process. It may also depend on the type of reaction method utilized. It is preferred that the mole ratio of styrene derivative to salicylate used to make the salicylic acid/styrene polyvalent metal salt utilized in the invention be 2:1 to 7:1, and more preferably 3:1 to 6:1. In a preferred process salicylate ester is reacted with a styrene derivative at low temperature as disclosed in U.S. Pat. No. 4,952,648, incorporated herein by reference.

It is preferred that the salicylic acid/styrene polyvalent metal salt be a zinc salt, although other multivalent metals such as aluminum, barium, lead, cadmium, calcium, chromium, iron, gallium, cobalt, copper, magnesium, manganese, molybdenum, nickel, mercury, silver, strontium, tantalum, titanium, vanadium, tungsten, tin and zirconium may be utilized. Other preferred metals are aluminum, titanium, vanadium, and tin.

The composition may further comprise additives that are compatible with the salicylic acid/styrene polyvalent metal salt. Examples of such additives include antooxidants, light stabilizers such as UV absorbers, hindered amine light stabilizers, singlet oxygen quenchers, inorganic fillers, water insoluble resins such as epoxy resin, flow promoters or rheology modifiers, a hydrophobe such as hexadecane, and the like.

Preferably the color developer is incorporated into the imaging forming unit of the invention as particles which have a mean size from about 0.5 microns to about 5 microns, more preferably from about 0.7 microns to about 3 microns. Many methods of forming particles of a polyvalent polyvalent metal salt of salicylic acid/styrene copolymer are known in the art. Preferably the composition is made by the method of forming an aqueous dispersion of the developer composition by means of an organic solvent dispersion, which comprises the following steps.

(a) preparing an organic phase comprising one or more auxiliary solvents, a polyvalent polyvalent metal salt of salicylic acid/styrene developer, and a surfactant;

(b) preparing a separate aqueous phase containing a water soluble polyermeric dispersant;

(c) dispersing the organic phase into the aqueous phase using a high sheer method to form a dispersed composition; and (d) removing the auxiliary solvent from the dispersed composition;

wherein the pH maintained during the process is greater than 6.

The auxiliary organic solvent may be any solvent which will dissolve the polyvalent polyvalent metal salt of salicylic acid/styrene copolymer developer. The amount of low boiling organic solvent used to dissolve the developer composition is not particularly limiting, however a minimum amount of solvent is preferred in order to facilitate evaporation of the solvent after droplet formation. Useful ranges of organic solvent to developer composition on a weight basis varreis from about 0.2:1 to 20:1, more preferably, from about 0.5:1 to 10:1 and most preferably, from about 0.5:1 to about 5:1.

Examples of useful organic solvents, preferably low boiling, include; propyl acetate, isopropyl acetate, ethyl acetate, acetone, methyl ethyl ketone, dichloroethane, methyl isobutyl ketone, isopropanol, isobutanol, toluene, xylene, dichloromethane, and the like. Preferred solvents include propyl acetate, isopropyl acetate, ethyl acetate, methyl ethyl ketone, dichloroethane, toluene, dichloromethane. Any combination of low boiling organic solvents may be used to dissolve the developer composition and the mixture may be heated to below the boiling point of the organic solvent to achieve complete dissolution of the developer composition.

The surfactant may be dissolved in the organic to control the average particle size, width of the distribution of particles, and colloidal stability of the aqueous suspension. The amount of dispersant used to prepare the aqueous dispersion is not particularly restricted. Typical amount ranges from 0.01% to 10% of the organic phase, and prefereably from 0.01% to 5%, and more preferably from 0,1% to 5%. Surfactants that can be used include, for example, a sulfate, a sulfonate, a cationic compound, or an amphoteric compound, and an oil soluble polymeric protective colloid. Specific examples are described in "McCUTCHEON'S Volume 1: Emulsifiers & Detergents, 1995, North American Edition" and include, for example, alkali polyvalent metal salts of alkylbenzene sulfonic acids, substituted napthalene sulfonic acids, alkylsulfosuccinic acids, alkyl diphenyl oxide sulfonic acids, alpha olephin sulfonic acids, alkyl polyglycosides, ethoxylated alkyl phenols, ethoxylated alcohols, polyglycidols, block copolymers of ethoxylated/propoxylated alcohols. The preferred surfactant is an alkali salt of an alkylsulfosuccinic acid.

The water soluble polymeric dispersants include, but are not limited to, polyacrylamide, polyvinyl alcohol, polyvinyl pyrrolidone, sulfonated polyvinyl alcohol, carboxylated polyvinyl alcohol, sulfonated polystyrene, polyacrylic acid, maleic anydride-vinyl copolymers, carboxymethylcellulose, hydroxyethylcellulose, gelatin, and the like. The preferred water soluble polymeric dispersant is polyvinyl alcohol.

The organic phase may be dispersed into the aqueous phase using any known high sheer method, preferably by means of a mechanical mixer such as a rotor-stator mixer, a homogenizer, a microfluidizer, and the like. There is no restriction on the addition of phases as the organic phase may be added to the aqueous phase or the aqueous phase may be added to the organic phase, provided that sufficient agitation is applied during mixing.

The pH utilized in the process for the developer dispersion making is preferably greater than 6. Preferably the pH value of the finished dispersion is greater than 6. The organic solvent is then removed using suitable temperature and pressure so as to evaporate the solvent from the aqueous dispersion. It is highly preferred that there be nearly complete removal of the organic solvent in order to achieve good stability of the particles of the developer composition of the present invention. The residual volatile organic solvent must be less than about 2%, more preferably less than 1% and most preferably less than about 0.5% by weight of the final aqueous dispersion.

Prefereably a pH adjustment step follows the solvent evaporation step whereby the pH of the resulting aqueous dispersion of the developer composition is raised to above 9.0. This may be accomplished with any suitable base including, for example, sodium hydroxide, potassium hydroxide, triethanol amine, N,N-dimethyl ethanolamine, triethylamine, and the like. The final concentration of solids in the aqueous dispersion is about 50% solids or less and can be achieved by further distillation of water from the dispersion once the volatile organic solvent is removed.

The imaging element of the invention comprises a support and above the support a light sensitive and heat developable image forming unit or light and pressure developable image forming unit. In one embodiment, a multicolor image can be realized using an imaging element produced by producing a plurality of single-color image forming layers within the image forming unit, each of which contains microcapsules enclosing a color-forming component designed to form a different color, and irradiating the imaging element with a plurality of light sources each having a different wavelength.

That is, the light sensitive and heat developable imaging layer or light sensitive and pressure developable imaging layer has a structure produced by providing on a support a first imaging layer which contains microcapsules containing a color-forming component for developing a yellow color and a photopolymerization composition sensitive to a light source having a central wavelength of $\lambda_1$, providing on top of the first imaging layer a second imaging layer which contains microcapsules containing a color-forming component for developing a magenta color and a photopolymerization composition sensitive to a light source having a central wavelength of $\lambda_2$, and providing on top of second imaging layer a third imaging layer which contains microcapsules containing a color-forming component for developing a cyan color and a photopolymerization composition sensitive to a light source having a central wavelength of $\lambda_3$. In addition, if necessary, the imaging layer may have an intermediate layer between the different colored imaging layers. The above-mentioned central wavelengths $\lambda_1$, $\lambda_2$, and $\lambda_3$ of the light sources differ from each other.

The light sensitive and heat developable image forming unit layer or light sensitive and pressure developable image forming unit of the present invention may have any number of the imaging layers. Preferably, the imaging layer may contain first to i th layers, each layer is sensitive to light having a central wavelength different from the light having a central wavelength to which other layers are sensitive, and each layer develops a color different from that of other layers. For example, the first imaging layer is sensitive to light having a central wavelength of $\lambda_1$ and develops a color, a second imaging layer is sensitive to light having a central wavelength of $\lambda_2$ and develops a color different from the color of the first imaging layer, and an ith imaging layer is sensitive to light having a central wavelength of $\lambda_i$ and develops a color different from the colors of i-1 th imaging layer.

The multicolor image can also be realized using an imaging element by producing a multicolor image forming unit in which all of the microcapsules are in one layer. The layer contains microcapsules of which each type contains a color-forming component of a different color, is sensitive to light having a central wavelength different from the light having a central wavelength to which other types of microcapsules are sensitive, and develops a color different from the color other types develop. For example, the first type of microcapsule is sensitive to light having a central wavelength of $\lambda_1$ and develops a color, a second type is sensitive to light having a central wavelength of $\lambda_2$ and develops a color different from the color of the first type of microcapsules, and an i th type of microcapsules is sensitive to light having a central wavelength of $\lambda_i$ and develops a color different from the colors of i-1 th type of microcapsules. In the present invention, i is preferably any integer selected from 1 to 10, more preferably any integer selected from 2 to 6, and most preferably any integer selected from 2 to 4. When images are formed using an imaging material having a multicolor image forming unit like the one for use in the present invention, the exposure step consists of image-wise exposure using plural light sources whose wavelengths match the absorption wavelengths of the imaging layers, respectively, and are different from each other. This exposure enables the imaging layers whose absorption wavelengths match the wavelengths of the respective light sources to form latent images selectively. Because of this, multicolor images can be formed with a high sensitivity and in high sharpness. Furthermore, since the background, which is colored with such compounds as a spectral sensitizing compound and a photopolymerization initiator, can be decolorized by irradiating the imaging layer surface with light, high-quality images having a high contrast can be formed.

The light sensitive and heat developable or light sensitive and pressure developable image forming unit or imaging layers of the invention also contain a binder material. There is no limitation on the choice of the binder material as far as it is compatible with other components incorporated in the layer or unit. The binder material includes, for example, water-soluble polymers, water dispersible polymers, and latex. Specific examples include proteins, protein derivatives, cellulose derivatives (e.g. cellulose esters), polysaccharides, casein, and the like, and synthetic water permeable colloids such as poly(vinyl lactams), acrylamide polymers, poly(vinyl alcohol) and its derivatives, hydrolyzed polyvinyl acetates, polymers of alkyl and sulfoalkyl acrylates and methacrylates, polyamides, polyvinyl pyridine, acrylic acid polymers, maleic anhydride copolymers, polyalkylene oxide, methacrylamide copolymers, polyvinyl oxazolidinones, maleic acid copolymers, vinyl amine copolymers, methacrylic acid copolymers, acryloyloxyalkyl sulfonic acid copolymers, vinyl imidazole copolymers, vinyl sulfide copolymers, and homopolymer or copolymers containing styrene sulfonic acid. Binder also include dispersions made of solvent soluble polymers such as polystyrene, polyvinyl formal, polyvinyl butyral, acrylic resins, e.g., polymethyl acrylate, polybutyl acrylate, polymethyl methacrylate, polybutyl methacrylate, and copolymers thereof, phenol resins, styrene-butadiene resins, ethyl cellulose, epoxy resins, and urethane resins, and latices of such polymers.

The binder is preferably cross-linked so as to provide a high degree of cohesion and adhesion. Cross-linking agents or hardeners which may effectively be used in the coating compositions of the present invention include aldehydes, epoxy compounds, polyfunctional aziridines, vinyl sulfones, methoxyalkyl melamines, triazines, polyisocyanates, dioxane derivatives such as dihydroxydioxane, carbodiimides, chrome alum, zirconium sulfate, and the like.

The light sensitive and heat developable or light sensitive and pressure developable image forming unit or imaging layer thereof may also contain various surfactants for such purposes as a coating aid, an antistatic agent, an agent to improve sliding properties, an emulsifier, an adhesion inhibitor. Examples of the surfactant that can be used include nonionic surfactants such as saponin, polyethylene oxide, and polyethylene oxide derivatives, e.g., alkyl ethers of polyethylene oxide; anionic surfactants such as alkylsulfonates, alkylbenzenesulfonates, alkylnaphthalenesulfonates, alkylsulfuric esters, N-acyl-N-alkyltaurines, sulfosuccinic esters, and sulfoalkylpolyoxyethylene alkylphenyl ethers; amphoteric surfactants such as alkylbetaines and alkylsulfobetaines; and cationic surfactants such as aliphatic or aromatic quaternary ammonium salts.

Furthermore, if necessary the light and heat sensitive or light sensitive and pressure developable image forming unit or an imaging layer thereof may contain additives other than those described above. For example, dyes, ultraviolet absorbing agents, plasticizers, fluorescent brightenesr, matting agents, coating aids, hardeners, antistatic agents, and sliding property-improving agents. Typical examples of these additives are described in Research Disclosure, Vol. 176 (1978, December, Item 17643) and Research Disclosure, Vol. 187 (1979, November, Item 18716).

Examples of the support for use in the imaging material of the present invention include paper; coated paper; synthetic paper such as laminated paper; films such as polyethylene terephthalate film, cellulose triacetate film, polyethylene film, polystyrene film, and polycarbonate film; plates of metals such as aluminum, zinc, and copper; and these supports whose surface is treated with a surface treatment, a subbing layer or metal vapor deposition. A further example is the support described in Research Disclosure, Vol. 200 (1980, December, Item 20036 XVII). These supports may contain a fluorescent brightener, a bluing dye, a pigment, or other additives. Furthermore, the support itself may be made of an elastic sheet such as a polyurethane foam or rubber sheet. Between a support and the light sensitive and heat developable or the light sensitive and pressure developable image forming unit, a layer, which comprises a polymer such as gelatin, polyvinyl alcohol (PVA), or the like having a low oxygen transmission rate, can be provided. The presence of this layer makes it possible to effectively prevent the fading due to photooxidation of the images formed.

The image element of the present invention can contain at least one electrically conductive layer, which can be either surface protective layer or a sub layer. The surface resistivity of at least one side of the support is preferably less than $1\times10^{12}$ Ω/square, more preferably less than $1\times10^{11}$ Ω/square at 25° C. and 20 percent relative humidity. To lower the surface resistivity, a preferred method is to incorporate at least one type of electrically conductive material in the electrically conductive layer. Such materials include both conductive metal oxides and conductive polymers or oligomeric compounds. Such materials have been described in detail in, for example, U.S. Pat. Nos. 4,203,769; 4,237,194; 4,272,616; 4,542,095; 4,582,781; 4,610,955; 4,916,011; and 5,340,676.

The image element of the invention can contain a curl control layer or a backing layer located opposite of the support to the imaging forming unit for the purposes of improving the machine-handling properties and curl of the recording element, controlling the friction and resistivity thereof, and the like. Typically, the backing may comprise a binder and a filler and optionally a lubricant. Typical fillers include amorphous and crystalline silicas, poly(methyl methacrylate), hollow sphere polystyrene beads, micro crystalline cellulose, zinc oxide and talc. The filler loaded in the backing is generally less than 5 percent by weight of the binder component and the average particle size of the filler material is in the range of 1 to 30 μm. Examples of typical binders used in the backing are polymers such as polyacrylates, gelatin, polymethacrylates, polystyrenes, polyacrylamides, vinyl chloride-vinyl acetate copolymers, poly(vinyl alcohol), gelatin and cellulose derivatives. Lubricants can be same as those incorporated in the outer protective layer located in the opposite side to the backing layer. Additionally, an antistatic agent also can be included in the backing to prevent static hindrance of the image element. Particularly suitable antistatic agents are compounds such as dodecylbenzenesulfonate sodium salt, octylsulfonate potassium salt, oligostyrenesulfonate sodium salt and laurylsulfosuccinate sodium salt, and the like. The antistatic agent may be added to the binder composition in an amount of 0.1 to 15 percent by weight, based on the weight of the binder. An image forming unit may also be coated on the backside, if desired.

Visible images can be made by heat development if the imaging element of the present invention is a light sensitive and heat developable imaging element or by pressure development if the imaging element of the present invention is a light sensitive and pressure developable imaging material. The heat or pressure development can be carried out either simultaneously with the exposure for latent image formation or after the exposure.

A conventionally known heating method can be employed for the heat development. Generally, the heating temperature is preferably 80 to 200° C., more preferably 83 to 160° C. and most preferably 85 to 130° C. The duration of heating is preferably in the range of 3 seconds to 1 minute, more preferably in the range of 4 to 45 seconds and most preferably in the range of 5 to 30 seconds.

The pressure development can be accomplished with a pressure applicator device. For example, the imaging material is developed by passing an exposed imaging media between a pair of calendar rollers that rupture the microcapsules, thereby allowing contact between the color-forming component and a developer that react to develop the image. The imaging material can also be developed by moving a point contact which is resiliently biased into engagement with the imaging sheet. Typically, the imaging sheet is secured to a cylinder and the point contact is positioned in resilient pressure contact with the imaging sheet. As the cylinder is rotated, the point contact is simultaneously moved along the cylinder in synchronism with the rotation of the cylinder to rupture the microcapsules and develop the image in the imaging sheet, or the imaging sheet may be mounted on a planer platform and the point contact is moved across the surface of the sheet using a screw thread in an X-Y transport device. The pressure that is to be applied is preferably 10 to 300 $kg/cm^2$, more preferably 80 to 250 $kg/cm^2$ and most preferably 130 to 200 $kg/cm^2$. If the pressure is less than 10 $kg/cm^2$, sufficient density of developed color may not be obtained, whereas, if the pressure exceeds 300 $kg/cm^2$, the discrimination of the images may not be sufficient because even the hardened microcapsules are broken.

The imaging element of the present invention comprises a photopolymerization initiator or the like such as a spectral sensitizing. Therefore, the imaging element of the present invention is colored with the photopolymerization initiator or the like. Since background is also colored with the compound, it is very important for the method of the present invention that the colored background is decolorized by irradiation after heat development.

Accordingly, it is preferable that, after the heat development, the image forming unit surface is irradiated with light to fix the images formed and to decolorize, decompose, or deactivate the components such as a spectral sensitizing compound which remain in the imaging layer and decrease the whiteness of the background. By carrying out the irradiation, it is possible to inhibit the coloration reaction. As a result, the density variation in the images can be inhibited and the image storability can be largely enhanced.

The imaging element of the invention is exposed imagewise to light according to the pattern of a desired image shape so that the photopolymerization forms a latent image. The color development step is accomplished by heat or/and pressure so that the color-forming components develop colors according to the latent image to thereby produce images. The fixing step in which the imaging layer surface is irradiated with light so as to fix the image formed and decolorize the organic dyes.

In the exposure step, it is possible to employ, for example, a means for exposing the whole face to an amount of light which has wavelengths corresponding to the sensitive regions of respective colors and can provide a desired density of the developed color. The light source for use in the exposure step may be any light source selected from the light sources having wavelengths ranging from ultraviolet to infrared light if the light sensitive and heat developable imaging layer contains a light-absorbing material such as a spectral sensitizing compound that exhibits an absorption in a specific wavelength region. More specifically, a light source providing maximum absorption wavelengths ranging from 300 to 1000 nm is preferable. It is preferable to select and use a light source whose wavelength matches the absorption wavelength of the light-absorbing material such as an organic dye to be used. The selective use of such light-absorbing material enables the use of a blue to red light source and the use of a small-sized, inexpensive infrared laser device and consequently not only broadens the use of the imaging material of the present invention but also raises sensitivity and image sharpness. Among the light sources, it is particularly preferable to use a laser light source such as a blue, green, or red laser light source or an LED from the viewpoint of simplicity, downsizing, and low cost of the device.

After the color development step, the image forming unit surface is subjected to a fixing step in which the whole imaging layer surface is irradiated with light from a specific light source to fix the images formed and to decolorize photopolymerization initiator components remaining in the imaging layer. As for the light source that can be used in the fixing step, a wide range of light sources, such as a mercury lamp, an ultrahigh pressure mercury lamp, an electrodeless discharge-type mercury lamp, a xenon lamp, a tungsten lamp, a metal halide lamp, and a fluorescent lamp, can be suitably used. The method of irradiating the image forming unit with light from the light source in the fixing step is not particularly limited. The whole image forming unit surface may be irradiated with light at one time or the image forming unit surface may be gradually irradiated with light by scanning or the like until the irradiation of the surface finally ends. That is, any method that finally enables the irradiation of the entire surface of the image forming unit material after image formation with nearly uniform light may be employed. The irradiation of the entire image forming unit layer is preferable from the standpoint of the enhancement of the effects of the present invention. The duration of the irradiation with light from the light source needs to be the time period that allows the produced images to be fixed and the background to be sufficiently decolorized. In order to perform sufficient fixing of images and decolorization, the duration of the irradiation is preferably in the range of several seconds to tens of minutes and more preferably in the range of several seconds to several minutes.

The following examples illustrate the practice of this invention. They are not intended to be exhaustive of all possible variations. Parts and percentages are by weight unless otherwise indicated.

EXAMPLES

The following organic phase and aqueous phase are used to form microcapsules at different homogenization conditions and stabilizer concentrations. The organic phase was formed by mixing together 198.2 grams of trimethylolpropane triacrylate, 23.8 grams of Pergascript Red from Ciba-Geigy, 0.6 grams of Altax from J. T. Vanderbilt, and 10 grams of Irganox 1010 from Ciba-Geigy at 85° C., followed by cooling down to 70° C. before 10 grams of Desmodur N-100 and 10 grams of Desmodur from Mobay were added. The aqueous phase was formed by mixing together 440 grams of water, pectin, and a mixure of sodium polystyrene sulfonate TL502 (MW 600,000) and poly(styrenesulfonic acid-co-maleic acid) (3:1) (MW 20,000) sodium salt at different concentrations and weight ratios which will be described in the following examples. The mixture was heated to 85° C. for an hour, pH adjusted to 5.5 with a 10% sodium carbonate, cooled down to room temperature.

Example 1

The prepared organic phase and aqueous phase were mixed using a propeller mixer at 1000 rpm for 10 minutes to form a premix. The aqueous phase comprised 6 grams of pectin, 6 grams of Versa TL 502, and 5 grams of poly (styrenesulfonic acid-co-maleic acid) (3:1) sodium salt (MW 20,000). The premix was then passed through a homogenizer once at a pressure of 4000 psi. The resultant mixture was stirred at 500 rpm for 20 minutes before a mixture containing 15.2 grams of diethylene tetraamine (DETA) in 120 grams of water was added, which was followed by the addition of a mixture containing 5 grams poly(styrenesulfonic acid-co-maleic acid) (3:1) sodium salt, 0.16 grams of NaOH, and 16 grams of water. After curing for an hour at 40° C., the reaction mixture was heated to 70° C. for curing for an additional 40 minutes before a melamine-formaldehyde prepolymer solution was added over 20 minutes. The melamine-formaldehyde prepolymer solution was formed by reacting 19.5 grams of melamine and 12.6 grams of paraformaldehyde in 196 grams of water in the presence of a trace amount of NaOH. The reaction mixture was stirred at 70° C. for another 2 hours followed by addition of 100 grams of 10% aqueous Airvol 205 (Air Product) solution and 48.6 grams of 26% aqueous urea solution. After curing for an additional 40 minutes, the reaction mixture of cooled down to room temperature. The pH was adjusted to 9 using a 10% NaOH solution.

The microcapsules prepared had a mean size of about 4 micron and a size distribution index of about 1.26 as measured by Beckman Coulter Multisizer. The size distribution index is expressed as the ratio of volume average size to number average size.

Example 2

The microcapsules were prepared in a similar manner as in Example 1 except that the aqueous phase comprised 6 grams of pectin, 3.6 grams of Versa TL 502 (MW600,000), and 3 grams of poly(styrenesulfonic acid-co-maleic acid) (3:1) sodium salt (MW 20,000) and a homogenization pressure of 8000 psi was used.

The microcapsules prepared had a mean size of about 4.97 microns and a size distribution index of about 1.3 as measured by Beckman Coulter Multisizer.

Example 3

The microcapsules were prepared in a similar manner as in Example 2 except that the aqueous phase comprised 6 grams of pectin, 3.6 grams of Versa TL 502, and 4.5 grams of poly(styrenesulfonic acid-co-maleic acid) (3:1) sodium salt (MW 20,000).

The microcapsules prepared had a mean size of about 4.6 microns and a size distribution index of about 1.36 as measured by Beckman Coulter Multisizer.

Example 4

The microcapsules were prepared in a similar manner as in Example 2 except that the aqueous phase comprised 10 grams of pectin, 6 grams of Versa TL 502, and 5 grams of poly(styrenesulfonic acid-co-maleic acid) (3:1) sodium salt (MW 20,000).

The microcapsules prepared had a mean size of about 3.47 micron and a size distribution index of about 1.29 as measured by Beckman Coulter Multisizer.

The results from Examples 1 through 4 clearly demonstrate that the particle size and size distribution of microcapsules prepared by the process of the invention is controlled by the stabilizer composition and is insensitive to changes in homogenization pressure.

The invention has been described in detail with particular reference to certain preferred embodiments thereof, but it will be understood that variations and modifications can be effected within the spirit and scope of the invention.

What is claimed is:

1. A composition comprising microcapsules suspended in an aqueous media, said microcapsules comprising a water immiscible material contained within an encapsulating wall of polymeric material, wherein the aqueous media contains a stabilizer comprising an anionic polymer mixture comprising a first sulfonated polystyrene polymer and a second sulfonated polystyrene polymer wherein the ratio of the weight average polymer molecular weight of the first polymer to the second polymer is greater than 2.

2. The composition of claim 1 wherein the weight average molecular weight of the first polymer is greater than 500,000.

3. The composition of claim 1 wherein the weight average molecular weight of the first polymer is greater than 1,000,000.

4. The composition of claim 1 wherein the weight average molecular weight of the second polymer is less than 300,000.

5. The composition of claim 2 wherein the weight average molecular weight of the second polymer is less than 300,000.

6. The composition of claim 1 wherein the weight ratio of the amount of the first polymer to the second polymer is from 1:10 to 10:1.

7. The composition of claim 1 wherein the weight ratio of the amount of the first polymer to the second polymer is from 30:70 to 70:30.

8. The composition of claim 1 wherein the first polymer comprises greater than 50% styrene sulfonic acid monomer units.

9. The composition of claim 1 wherein the first polymer comprises greater than 80% styrene sulfonic acid monomer units.

10. The composition of claim 1 wherein the second polymer comprises greater than 30% styrene sulfonic acid monomer units.

11. The composition of claim 1 wherein the second polymer is a poly(styrenesulfonic acid-co-maleic acid) salt.

12. The composition of claim 1 wherein the stabilizer further comprises pectin.

13. The composition of claim 1 wherein the microcapsules have a mean particle size of greater than 0.5 microns.

14. The composition of claim 1 wherein the microcapsules have a mean particle size of greater than 2.0 microns.

15. The composition of claim 1 wherein the microcapsules have a mean particle size of less than 20 microns.

16. The composition of claim 1 wherein the microcapsules have a mean particle size of less than 10 microns.

17. The composition of claim 13 wherein the microcapsules have a mean particle size of less than 20 microns.

18. The composition of claim 1 wherein the total stabilizer concentration in the aqueous media is less than 10% by weight.

19. The composition of claim 1 wherein the total stabilizer concentration in the aqueous media is less than 6% by weight.

20. The composition of claim 1 wherein the total stabilizer concentration in the aqueous media is less than 4% by weight.

21. The composition of claim 1 wherein the microcapsules are photohardenable.

22. The composition of claim 1 wherein the water immiscible material is a color precursor which can react with a developer material to form color.

23. The composition of claim 1 wherein stabilizer comprises pectin and a polymer mixture of a first polymer comprising greater than 80% styrene sulfonic acid monomer units and having a weight average molecular weight of greater than 500,000 and a second polymer comprising less than 30% styrene sulfonic acid monomer units and having a weight average molecular weight of less than 300,000.

24. An imaging element comprising a support and at least one image forming unit comprising microcapsules suspended in an aqueous media, said microcapsules comprising a water immiscible material contained within an encapsulating wall of polymeric material, wherein the aqueous media contains a stabilizer which contains an anionic polymer mixture comprising a first sulfonated polystyrene polymer and a second sulfonated polystyrene polymer wherein the ratio of the weight average polymer molecular weight of the first polymer to the second polymer is greater than 2.

25. The imaging element of claim 24 wherein the weight average molecular weight of the first polymer is greater than 500,000.

26. The imaging element of claim 24 wherein the weight average molecular weight of the first polymer is greater than 1,000,000.

27. The imaging element of claim 24 wherein the weight average molecular weight of the second polymer is less than 300,000.

28. The imaging element of claim 2 wherein the weight average molecular weight of the second polymer is less than 300,000.

29. The imaging element of claim 24 wherein the ratio of the amount of the first polymer to the second polymer is from 1:10 to 10:1.

30. The imaging element of claim 24 wherein the ratio of the amount of the first polymer to the second polymer is from 30:70 to 70:30.

31. The imaging element of claim 24 wherein the first polymer comprises greater than 50% styrene sulfonic acid monomer units.

32. The imaging element of claim 24 wherein the first polymer comprises greater than 80% styrene sulfonic acid monomer units.

33. The imaging element of claim 24 wherein the second polymer comprises greater than 30% styrene sulfonic acid monomer units.

34. The imaging element of claim 24 wherein the second polymer is a poly(styrenesulfonic acid-co-maleic acid) salt.

35. The imaging element of claim 24 wherein the stabilizer further comprises pectin.

36. The imaging element of claim 24 wherein the microcapsules have a mean particle size of greater than 0.5 microns.

37. The imaging element of claim 24 wherein the microcapsules have a mean particle size of greater than 2.0 microns.

38. The imaging element of claim 24 wherein the microcapsules have a mean particle size of less than 20 microns.

39. The imaging element of claim 24 wherein the microcapsules have a mean particle size of less than 10 microns.

40. The imaging element of claim 37 wherein the microcapsules have a mean particle size of less than 20 microns.

41. The imaging element of claim 24 wherein the total stabilizer concentration in the aqueous media is less than 10% by weight.

42. The imaging element of claim 24 wherein the total stabilizer concentration in the aqueous media is less than 6% by weight.

43. The imaging element of claim 24 wherein the total stabilizer concentration in the aqueous media is less than 4% by weight.

44. The imaging element of claim 24 wherein the microcapsules are photohardenable.

45. The imaging element of claim 24 wherein the water immiscible material is a color precursor which can react with a developer material to form color.

46. The imaging element of claim 24 wherein stabilizer comprises pectin and a polymer mixture of a first polymer comprising greater than 80% styrene sulfonic acid monomer units and having a weight average molecular weight of greater than 500,000 and a second polymer comprising less than 30% styrene sulfonic acid monomer units and having a weight average molecular weight of less than 300,000.

47. The imaging element of claim 44 wherein the imaging element is light sensitive and heat or pressure developable.

48. The imaging element of claim 47 wherein the imaging element is light sensitive and pressure developable.

49. The imaging element of claim 47 wherein the microcapsules encapsulate a color precursor which can react with a developer material in the same image forming unit.

* * * * *